TUNING FORK REFERENCE OSCILLATORS WITH TIME DURATION CONTROL

Filed Oct. 2, 1961

INVENTOR
Winston O. Faith

BY Arthur M. Sloan
ATTORNEY

United States Patent Office 3,192,486

Patented June 29, 1965

3,192,486

TUNING FORK REFERENCE OSCILLATORS WITH TIME DURATION CONTROL

Winston O. Faith, Garland, Tex., assignor to Varo, Inc.

Filed Oct. 2, 1961, Ser. No. 142,374
2 Claims. (Cl. 331—116)

The present invention relates to a frequency generator.

Frequency generators heretofore used utilize various types of phase-shift oscillators to drive tuning forks, crystals, or other synchronizing devices. In these frequency generators which utilize phase-shift oscillators as drivers, the output frequency is somewhat dependent upon the parameters of the oscillator and thus a frequency exactly equal to the undamped resonant frequency of the synchronizing device is not produced.

Accordingly, it is the primary object of this invention to provide a frequency generator producing a frequency more nearly approaching the undamped resonant frequency of the synchronizing device than frequency generators heretofore used.

Another object of the invention is to provide a frequency generator which generates an oscillating electrical signal that has a frequency stability determined by the inherent accuracy of the synchronizing device.

A further object of the invention is to provide a frequency generator producing an electrical signal of frequency equal to a particular subharmonic of the synchronizing device.

A still further object of the invention is to provide a frequency generator in which the oscillator has a frequency negligibly affected by any part of the oscillator circuit other than the synchronizing device.

In accordance with my invention, a unijunction transistor is used as a pulse drive element to sustain oscillation of a synchronizing device such as a tuning fork, and in turn the output of the synchronizing device provides a signal to initiate the pulse at the proper time in the cycle. A variation of the basic circuit is used to provide subharmonic frequencies of the synchronizing device to a very high accuracy.

Further objects of this invention will be apparent to those skilled in the art from consideration of the following description taken in connection with the accompanying drawings.

Figure 1:
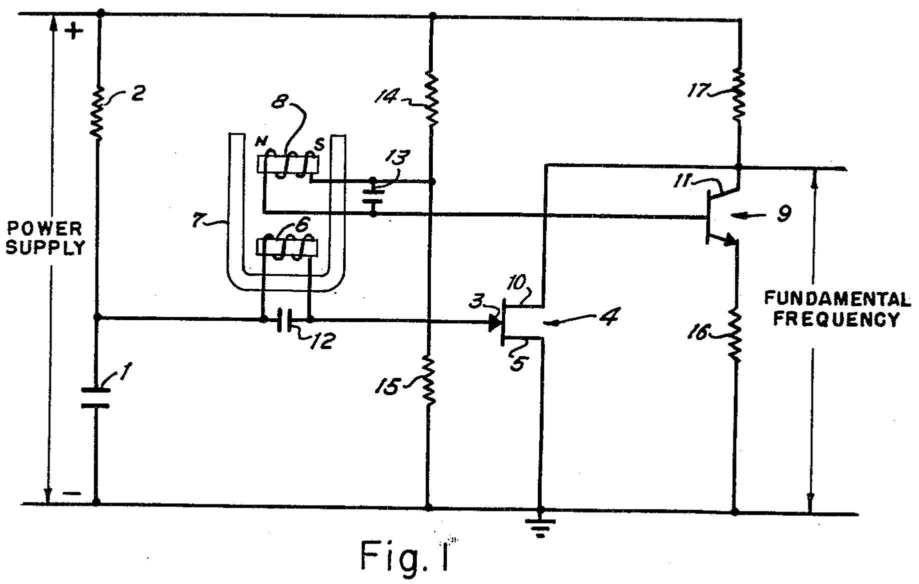
FIGURE 1 is a schematic diagram of the basic frequency generator circuit in accordance with the invention.

Referring to FIGURE 1, a tuning fork 7 is shown as the synchronizing device. To start the generator, power is supplied from a direct current source as indicated in the drawing, and capacitor 1 is charged through resistor 2. During the charging period, the emitter electrode 3 of the unijunction transistor 4 is, for all practical purposes, an open circuit. When the voltage on capacitor 1 reaches a value equal to the power supply voltage multiplied by the intrinsic standoff ratio of the unijunction transistor 4, the unijunction transistor 4 becomes a negative resistance and discharges the capacitor 1 through the emitter electrode 3 and base-one electrode 5 of the unijunction transistor 4 to ground. The current of this discharge passes through the drive coil 6 of the tuning fork 7 for a short period of time. This pulse of current starts the tuning fork 7 to oscillating at its resonant frequency.

The output coil 8 of the tuning fork 7 generates a sine wave signal of a frequency equal to the natural resonance of the tuning fork 7.

Capacitors 12 and 13 are tuning capacitors which resonate with the inductance of the tuning fork coils to give maximum output at the tuning fork resonant frequency.

The signal generated by the output coil 8 of the tuning fork 7 is amplified by transistor 9.

Resistors 14, 15, and 16 provide a direct current bias level for the amplifier transistor 9. Resistor 17 is a collector load resistor for the amplifier transistor 9.

The signal amplified by transistor 9 is connected to the base-two electrode 10 of the unijunction transistor 4 so that the base-two electrode 10 to base-one electrode 5 voltage of the unijunction transistor 4, is being modulated proportional to the output of the tuning fork 7.

At the time the tuning fork 7 passes through center position (the time of peak output voltage) the base-two electrode 10 to base-one electrode 5 voltage is minimum. Simultaneously the emitter electrode 3 to base-one electrode 5 voltage is again increasing as a result of capacitor 1 charging through resistor 2 so that the unijunction transistor 4 turn on or firing point is again reached, and the energy stored in capacitor 1 is again discharged as a pulse of current through the drive coil 6 of the tuning fork 7 to further sustain oscillation at the natural resonant frequency of the tuning fork 7.

An alternating current output signal of a frequency identical to that of the tuning fork 7 can be taken from the collector electrode 11 of transistor 9. If a sine wave is present at the collector 11 of NPN transistor 9, then unijunction transistor 4 fires or conducts at a point approximately 90° on such wave.

Figure 2:
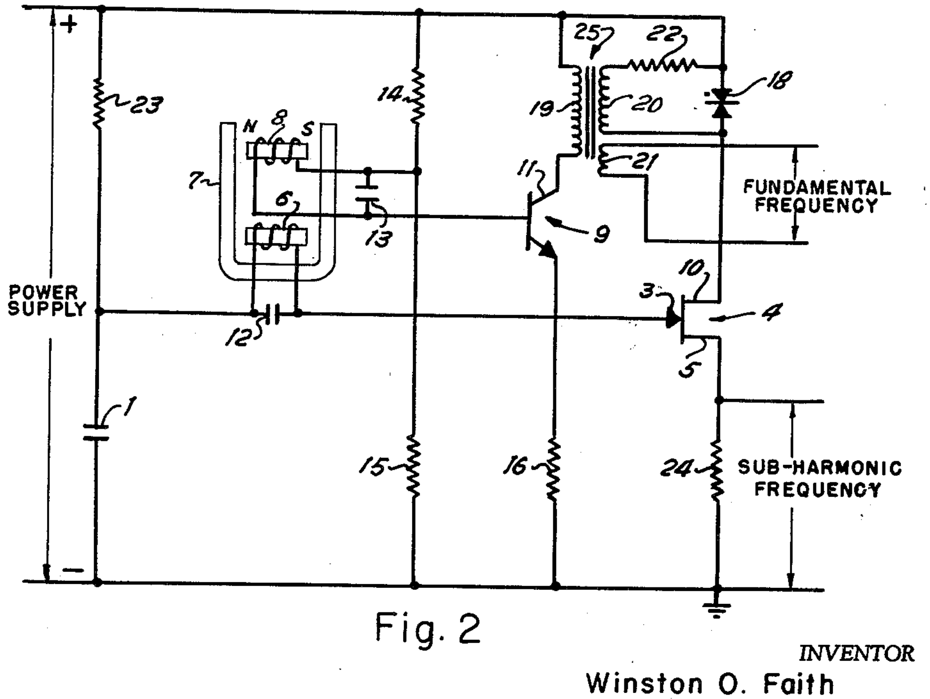
FIGURE 2 is a variation of the basic circuit diagram showing a frequency generator providing subharmonic frequencies.

Turning now to FIGURE 2, a schematic of a circuit which provides not only the fundamental frequency of a synchronizing device but also a specified subharmonic of the synchronizing device, the circuit is similar to the circuit in FIGURE 1 described above with certain exceptions as follows:

Capacitor 1 ($C_1$) and/ resistor 2 ($R_1$) are changed for a capacitor (C) and/or resistor (R) having values such that the time constant of RC is equal to the time constant of the natural resonance of the tuning fork 7 multiplied by the particular subharmonic desired. For example, if the third subharmonic is desired $RC=3R_1C_1$. In the example of FIGURE 2 capacitor 1 is retained and resistor 23 is substituted for resistor 2 so that $RC_1=3R_1C_1$.

Resistor 17 is replaced by the primary 19 of transformer 25.

The double anode zener diode 18 and resistor 22 provide voltage amplitude limiting to the signal fed back to the base-two electrode 10 of the unijunction transistor 4.

Resistor 24 is added in series with the base-one electrode 5 of the unijunction transistor 4.

In operation of the FIGURE 2 circuit, the unijunction transistor 4 fires every third cycle (since $RC=3R_1C_1$) rather than every cycle. As in the circuit of FIGURE 1, if a sine wave is present at the collector 11 of NPN transistor 9, then unijunction transistor 4 fires or conducts at a point approximately 90° on such wave.

The fundamental frequency output alternating current signal is available from the transformer secondary winding 21 while pulses of a frequency equal to the selected subharmonic (third in this example) are available across resistor 24.

The transformer secondary winding 20 is connected to resistor 22 and double anode zener diode 18.

The transformer 25 provides isolation between the amplifier transistor 9 and the unijunction transistor 4 so that the limiting function of double anode zener diode 18 and resistor 22 can be used. This limiting function minimizes any effect of power supply voltage change on the subharmonic frequency obtained.

While I have shown a particular embodiment of my invention, it will, of course, be understood that I do not wish to be limited thereto, since many modifications in the circuit arrangement and the structure may be made, and I contemplate by the appended claims to cover all such modifications as fall within the true spirit and scope of my invention.

What is claimed is:

1. A frequency generator comprising a tuning fork providing an output signal to initiate a pulse at a predetermined time in a cycle, a drive coil to cause the tuning fork to vibrate, a resistor and a capacitor in parallel with a source of direct current to start the frequency generator, the resistor and capacitor having a time constant equal to the time constant of the natural resonance of the tuning fork, a unijunction transistor to sustain oscillation of the tuning fork, said unijunction transistor having its emitter electrode connected between the resistor and capacitor through the ends of the drive coil, the drive coil having both of its ends connected to a tuning capacitor, and the unijunction transistor having its base-one electrode connected to ground, a tuning fork output coil, and an NPN transistor for amplifying the signal generated by the output coil, said transistor having its base electrode connected to the output coil, its emitter electrode connected to ground through a bias resistor, and its collector electrode connected to the base-two electrode of the unijunction transistor and a load resistor, the output coil having both of its ends connected to a tuning capacitor.

2. A frequency generator comprising a tuning fork providing an output signal to initiate a pulse at a predetermined time in a cycle, a drive coil to cause the tuning fork to vibrate, a resistor and a capacitor in parallel with a source of direct current to start the frequency generator, the resistor and capacitor having a time constant equal to the time constant of the natural resonance of the tuning fork multiplied by the particular subharmonic frequency desired, a unijunction transistor to sustain oscillation of the tuning fork, said unijunction transistor having its emitter electrode connected between the resistor and capacitor through the ends of the drive coil, the drive coil having both of its ends connected to a tuning capacitor, and the unijunction transistor having its base-one electrode connected to ground through a resistor, a tuning fork output coil, and an NPN transistor for amplifying the signal generated by the output coil, said transistor having its base electrode connected to the output coil and its emitter electrode connected to ground through a bias resistor, the output coil having both of its ends connected to a tuning capacitor, a double anode zener diode connected to the base-two electrode of the unijunction transistor and to a resistor, said double anode zener diode and resistor providing voltage amplitude limiting to the signal fed back to the base-two electrode of the unijunction transistor, and a transformer with two secondary windings having its primary winding connected to the collector of the NPN transistor, one of its secondary windings connected to the double anode zener diode, and the other secondary winding providing the fundamental frequency output alternating current signal, said transformer providing isolation between the unijunction transistor and the NPN transistor.

References Cited by the Examiner

UNITED STATES PATENTS

| | | | |
|---|---|---|---|
| 2,997,664 | 8/61 | Jensen | 331—183 |
| 3,074,028 | 1/63 | Mammano | 331—111 |

FOREIGN PATENTS

| | | |
|---|---|---|
| 698,278 | 10/53 | Great Britain. |

OTHER REFERENCES

RCA Tech. Note 133, March 1958.

ROY LAKE, *Primary Examiner.*

JOHN KOMINSKI, *Examiner.*